(12) United States Patent
Gladd et al.

(10) Patent No.: US 7,692,096 B2
(45) Date of Patent: Apr. 6, 2010

(54) ELECTROMAGNETICALLY SHIELDED CABLE

(75) Inventors: Joseph H. Gladd, Cortland, OH (US);
William C. Ketterer, Girard, OH (US);
Terry A. George, Salem, OH (US)

(73) Assignee: Delphi Technologies, Inc., Troy, MI (US)

( * ) Notice: Subject to any disclaimer, the term of this patent is extended or adjusted under 35 U.S.C. 154(b) by 11 days.

(21) Appl. No.: 11/999,883

(22) Filed: Dec. 7, 2007

(65) Prior Publication Data
US 2009/0145655 A1   Jun. 11, 2009

(51) Int. Cl.
*H01R 9/05* (2006.01)
(52) U.S. Cl. .................................... 174/75 C
(58) Field of Classification Search ............. 174/75 C, 174/78; 439/98
See application file for complete search history.

(56) References Cited

U.S. PATENT DOCUMENTS

| | | | |
|---|---|---|---|
| 3,406,373 A * | 10/1968 | Forney, Jr. .................. | 439/394 |
| 3,538,239 A * | 11/1970 | Renshaw, Jr. ............. | 174/75 C |
| 3,744,128 A | 7/1973 | Fisher et al. | |
| 4,090,767 A | 5/1978 | Tregoning | |
| 4,614,398 A | 9/1986 | Wright et al. | |
| 4,858,310 A | 8/1989 | Sanders | |
| 4,895,525 A * | 1/1990 | Leonardo ..................... | 439/99 |
| 6,123,556 A * | 9/2000 | Asakura et al. ............. | 439/99 |
| 6,682,360 B2 | 1/2004 | Schauer et al. | |
| 7,038,134 B2 | 5/2006 | Daugherty et al. | |

* cited by examiner

*Primary Examiner*—Chau N Nguyen
(74) *Attorney, Agent, or Firm*—Thomas N. Twomey

(57) ABSTRACT

An electromagnetically shielded cable includes a shell having an end portion and a shield embedded in the end portion of the shell. A method of forming the electromagnetically shielded cable is also provided. The method includes the steps of inserting the end portion of the shield into a mold, and embedding the end portion of the shield in the shell. In one embodiment, the shell includes a connector extending from the shell and through an opening defined by the shield for embedding the shield in the shell. In another embodiment, the shield is embedded directly in the end portion of the shell.

2 Claims, 3 Drawing Sheets

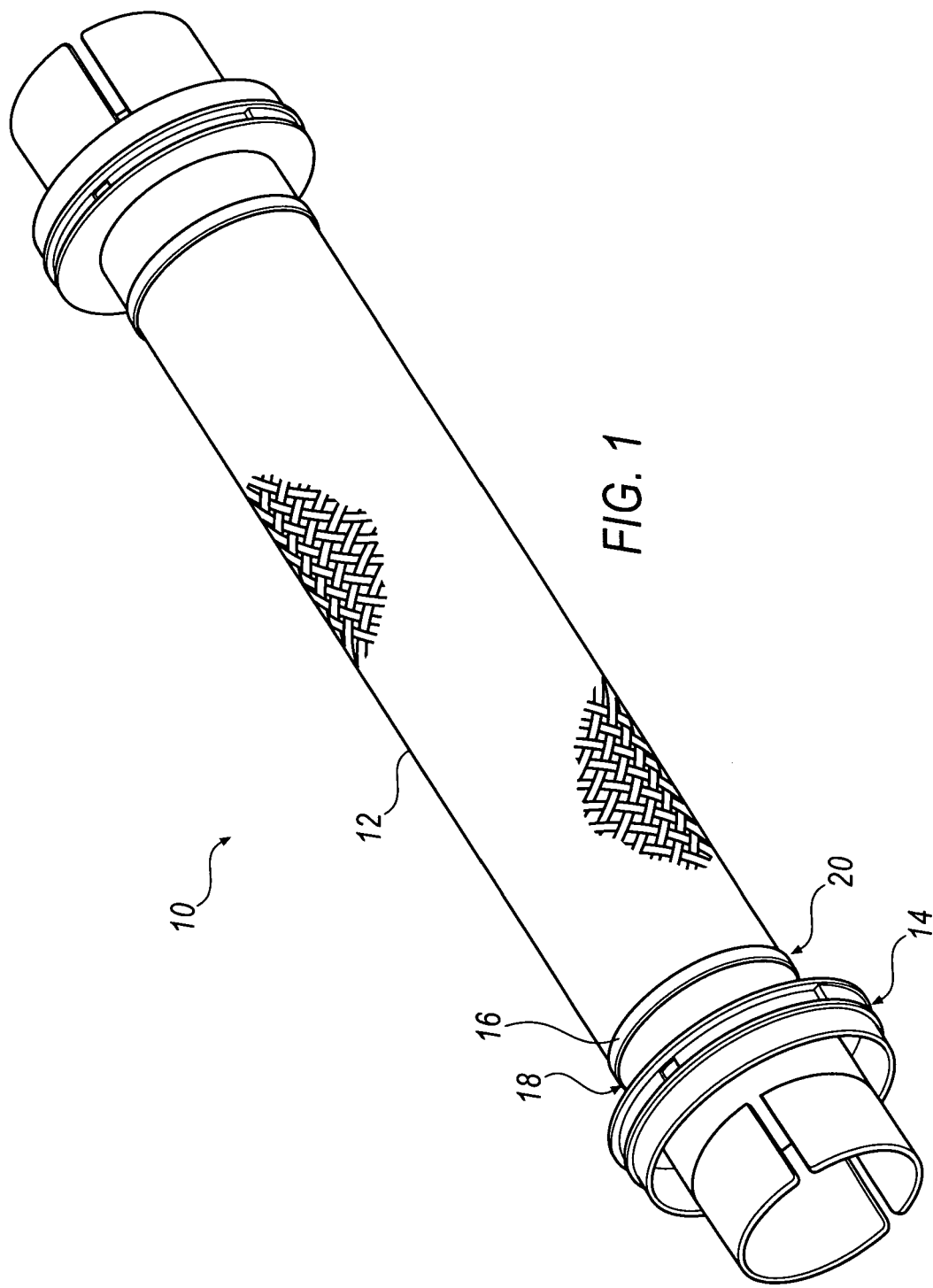

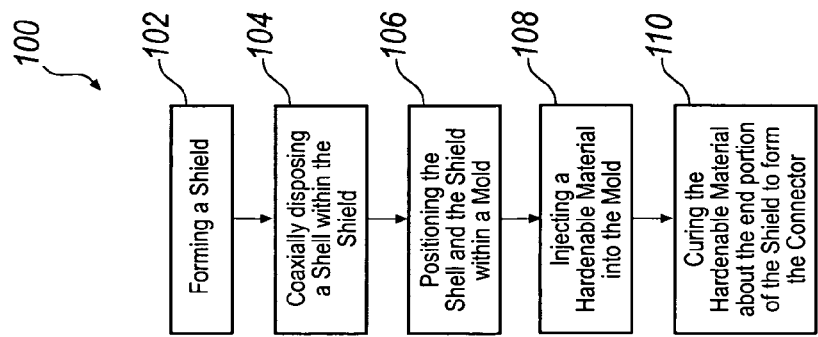
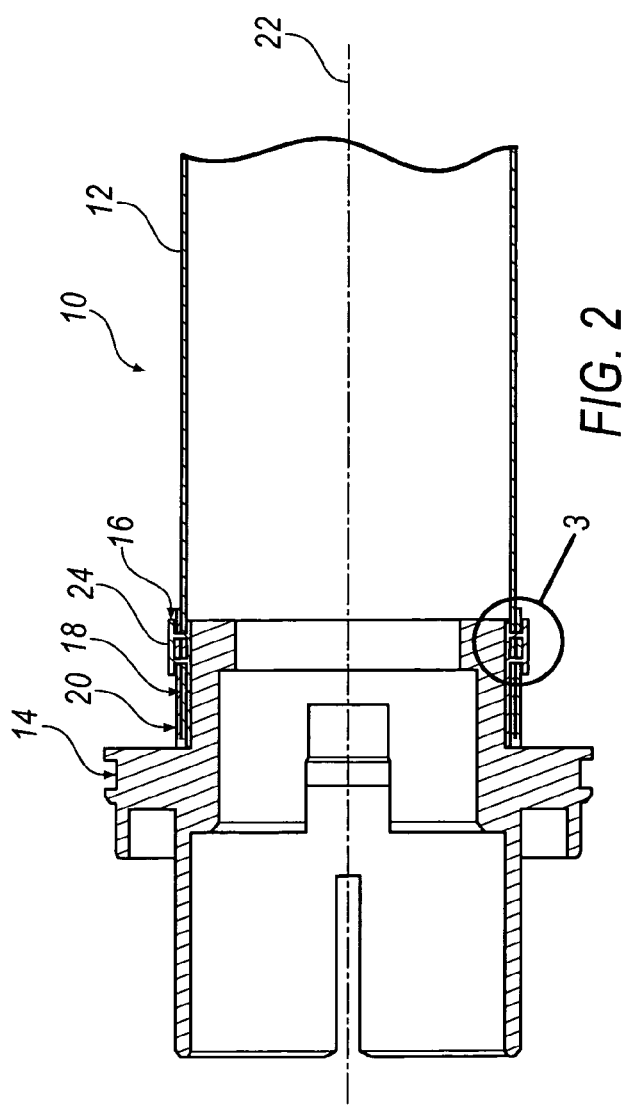
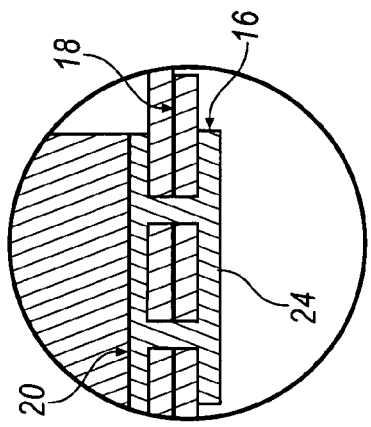

ELECTROMAGNETICALLY SHIELDED CABLE

FIELD

The present embodiments generally relate to an electromagnetically shielded cable and a method of forming the electromagnetically shielded cable.

BACKGROUND

Although electromagnetic radiation can be generated from any number of sources, including natural phenomenon like lightning strikes, the emergence of electronic devices, and specifically telecommunication devices, has rapidly increased the amount of electromagnetic radiation propagating through the air. This electromagnetic radiation can interfere with electronic devices by causing a current to flow through wires and other metallic objects. Since this extraneous current may generate unwanted signals, including a spike in current that can damage electronic components, some treat the rapid increase in electromagnetic radiation as a form of pollution. In addition, electromagnetic energy produced from internal electromagnetic sources, such as high current cables, can also radiate out of the wire and interfere with other electronic devices.

One way to combat these extraneous currents is to protect the wires of electronic devices from external electromagnetic radiation by using a braided metallic shield that covers and extends along the length of the wire. The braided metallic shield also prevents electromagnetic radiation from leaking out of the wire, reducing interference to external devices.

The braided shield generally includes a solid metal support crimped to a terminal end of the shield. Although generally effective, there are several difficulties when crimping the support to the shield. For instance, it may be difficult to spread the shield evenly over the support. Also, it may be difficult to hold the shield in place while trying to crimp the support to the shield, which may cause the shield to bunch on one side or have minimal contact pressure at certain places relative to the support, resulting in inconsistent crimps. In addition, the terminal end of the shield may need to be expanded when inserting the support, which separates the wires that form the braid in the shield, creating "holes." Unfortunately, the "holes" allow electromagnetic radiation to penetrate through the wire and interfere with transmitted signals on the wire, or allow electromagnetic radiation to escape the wire and interfere with external devices. Further, as the terminal end of the shield ages, the wires that make up the shield may begin to unravel, causing additional "holes" in the shield and weakening the crimp. The unraveling may further result in stray wires that require trimming. Moreover, the terminal end of the shield, as it begins to unravel, can cause galvanic corrosion between the shield and the metal support. Finally, determining the pull strength of the cable may be difficult when crimped in such a way.

Accordingly, an electromagnetically shielded cable is needed that provides a strong and consistent crimp between the shield and the shell.

SUMMARY

An electromagnetically shielded cable includes a shell having an end portion and a shield embedded in the end portion of the shell. A method of forming the electromagnetically shielded cable includes the steps of inserting an end portion of the shield into a mold and embedding the end portion of the shield in the shell.

BRIEF DESCRIPTION OF THE DRAWINGS

The present embodiments become better understood by reference to the following detailed description when considered in connection with the accompanying drawings, wherein:

FIG. 1 is a perspective view of an electromagnetically shielded cable according to an embodiment;

FIG. 2 is a cross-sectional side view of the electromagnetically shielded cable of FIG. 1 according to a first embodiment;

FIG. 3 is a close-up view of a connector integrally formed with a shell according to an embodiment;

FIG. 4 is a flowchart of a method of forming the electromagnetically shielded cable of FIGS. 1, 2, and 3 according to an embodiment;

DETAILED DESCRIPTION

Figure 6:
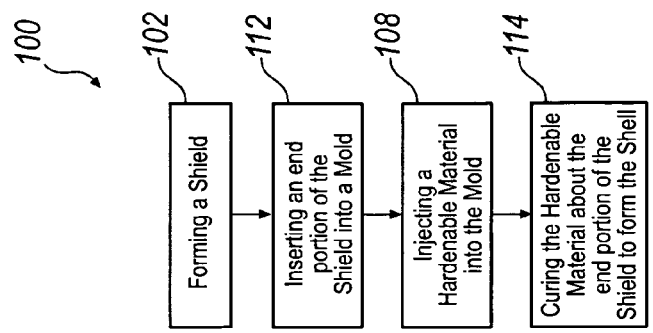
FIG. 6 is a flowchart of a method of forming the electromagnetically shielded cable of FIG. 5 according to an embodiment.

An electromagnetically shielded cable includes a shield having an end portion embedded in a shell. Embedding the end portion of the shield in the shell strengthens the connection between the shell and the shield, resulting in a stronger crimp, and reduces the amount of electromagnetic radiation that leaks into or out of the shell by reducing the number of holes in the shell. The method of forming the electromagnetically shielded cable includes inserting the end portion of the shield into a mold and embedding the end portion of the shield in the shell. Such a cable may be useful in any industry or application, including, but not limited to, an electric vehicle's propulsion system wiring to prevent interference with a radio or other electronic sources.

Referring to the Figures, wherein like numerals indicate like or corresponding parts, an exemplary electromagnetically shielded cable is shown generally at numeral 10. FIG. 1 is a perspective view of an exemplary embodiment of the electromagnetically shielded cable 10, which includes a shield 12 and a shell 14 disposed in the shield 12. As shown in FIG. 1, the shield 12 and the shell 14 have generally cylindrical configurations, however, one of ordinary skill in the art understands that the shield 12 and shell 14 may have other configurations. In one embodiment, the shell 14 includes a connector 16 extending through the shield 12 for embedding an end portion 18 of the shield 12 in an end portion 20 of the shell 14. The shield 12 may be formed from a plurality of wires braided together and is configured to reduce electromagnetic interference. The plurality of wires define at least one, opening and the connector 16 is disposed between at least two of the plurality of wires. The shield 12 presents an outer surface, and at least one opening is defined by the outer surface at the end portion 18 of the shield 12. The connector 16 extends through the at least one opening, although it is to be appreciated that the connector 16 may extend through two or more of the openings. Also, the connector 16 may have a continuous outer surface extending about a periphery of the shell 14.

FIG. 2 is a cross-sectional side view of an exemplary embodiment of the electromagnetically shielded cable 10. As illustrated, the shield 12 defines a longitudinal axis 22 and the shell 14 is disposed in an end portion 18 of the shield 12 along the longitudinal axis 22. In other words, the shell 14 and the shield 12 are coaxially aligned. The connector 16 extends from the shell 14 and through the opening in the shield 12 in a direction perpendicular to the longitudinal axis 22. Therefore, if the shield 12 and the shell 14 have a cylindrical configuration, the connector 16 may extend radially from the shell 14. However, it is to be appreciated that the connector 16 may extend from the shell 14 in other directions. As best shown in FIG. 3, the connector 16 may be formed to include a top portion 24 having a larger diameter than the opening. In addition, as discussed in greater detail below, the connector 16 may be integrally formed with the shell 14, such that the shell 14 and the connector 16 are one piece. In addition, the shield 12 is at least partially embedded in the shell 14. Specifically, in one embodiment, the connector 16 may be formed from a hardenable material such as molten metal. However, those with ordinary skill in the art appreciate that the connector 16 may be formed from other hardenable materials besides molten metal. As will be discussed in greater detail below, the molten metal cures around the shield 12 and through the openings in the shield 12 to form the shell 14 and the connector 16. Because the end portion 18 of the shield 12 is surrounded by the molten metal, when the molten metal is cured, the shield 12 becomes embedded in the shell 14 and/or the connector 16. It is to be appreciated that FIGS. 2 and 3 are simplified illustrations of how the connector 16 is integrally formed with the shell 14. As shown, the molten metal flows between two openings of the shell 12. However, the molten metal may flow through many more openings.

A method 100 of forming the electromagnetically shielded cable 10 includes inserting the end portion 18 of the shield 12 into a mold, and embedding the end portion 18 of the shield 12 in the end portion 20 of the shell 14. Referring to FIG. 4, in one embodiment, the method 100 may include a step 102 of forming the shield 12, which may include braiding the plurality of wires. In this embodiment, the shell 14 is preformed with respect to the connector 16. Therefore, inserting the end portion 18 of the shield 12 into the mold includes a step 104 of coaxially disposing the shell 14 within the shield 12 along the longitudinal axis 22. Specifically, the end portion 20 of the shell 14 is disposed within the end portion 18 of the shield 12, such that the end portion 18 of the shield 12 overlaps the end portion 20 of the shell 14. Inserting the end portion 18 of the shield 12 into the mold may further include a step 106 of positioning the shell 14 and the shield 12 in the mold. The mold may compress the end portion 18 of the shield 12 against the end portion 20 of the shell 14. In other words, the end portion 18 of the shield 12 is sandwiched between the mold and the end portion 20 of the shell 14. In the embodiment of FIG. 4, embedding the end portion 18 of the shield 12 in the shell 14 includes a step 108 of injecting a hardenable material into the mold. As previously stated, in one embodiment, the mold may be compressed against the end portion 18 of the shield 12 to prevent the hardenable material from escaping the mold. Specifically, the end portion 18 of the shield 12 that is internal to the mold and not compressed to the shell 14 gets flooded with the hardenable material. The method 100 may further include a step 110 of curing the hardenable material about the end portion 18 of the shield 12 to form the connector 16. Once cured, the connector 16 is integrally formed with the shell 14 and extends from the shell 14 through the opening defined by the outer surface of the shield 12. It is to be understood that the term "curing" may refer to any known physical or chemical process for hardening the hardenable material. For instance, if the hardenable material is a molten metal, curing may take place by allowing the molten metal to solidify (i.e., a physical process). However, curing may alternatively take place by introducing a hardener or cross-linker to the hardenable material (i.e., a chemical process).

Figure 5:
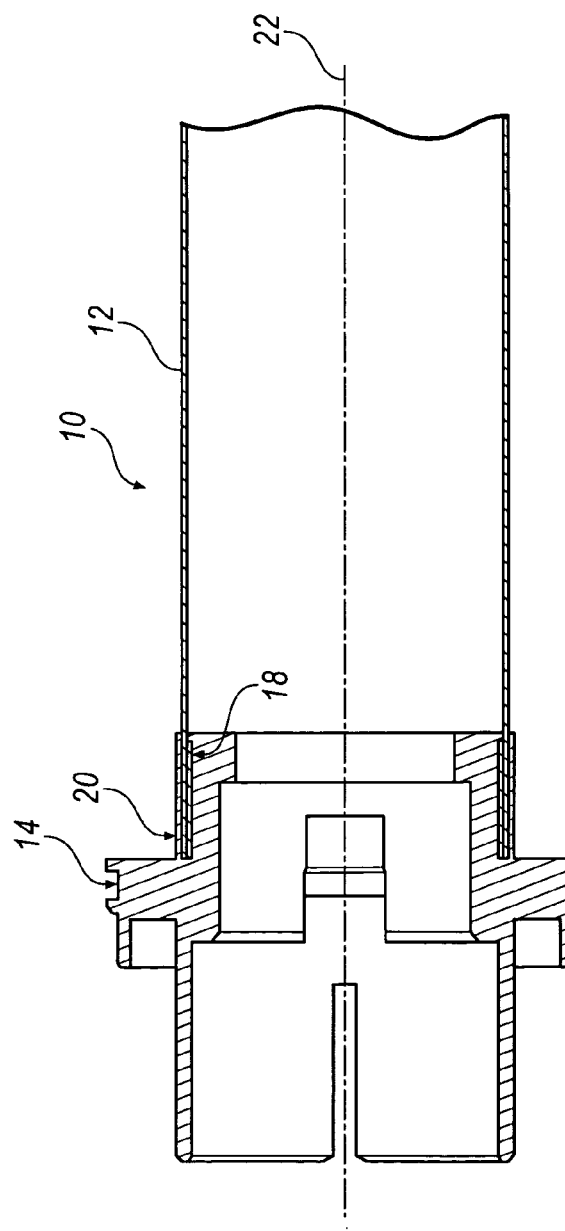
FIG. 5 is a cross-sectional side view of the electromagnetically shielded cable according to a second embodiment.

FIG. 5 is a cross-sectional side view of another embodiment of the electromagnetically shielded cable 10. As in the previous embodiment, the shield 12 defines the longitudinal axis 22 and the shell 14 is disposed in the shield 12 along the longitudinal axis 22. In other words, the shell 14 and the shield 12 are coaxially aligned. However, in this embodiment, the end portion 18 of the shield 12 is embedded directly into the end portion 20 of the shell 14 without the use of the connector 16 described above. It is to be appreciated, that FIG. 5 is also a simplified illustration of how the shield 12 may be embedded into the shell 14. Specifically, the molten metal may flow through the openings (not shown) of the shield 12 to provide an even greater connection.

FIG. 6 is a flowchart of an exemplary method of forming the electromagnetically shielded cable 10 shown in FIG. 5. Like in the previous embodiment, the method includes the step 102 of forming the shield 12, which may include braiding the plurality of wires. The method further includes a step 112 of inserting the end portion 18 of the shield 12 into the mold. The mold may compress the end portion 18 of the shield 12 against a portion of a core. In other words, the end portion 18 of the shield 12 is sandwiched between the mold and the core. In one embodiment, embedding the end portion 18 of the shield 12 in the end portion 20 of the shell 14 may include the step 108 of injecting the hardenable material into the mold about the end portion 18 of the shield 12. In one embodiment, the mold may be compressed against the end portion 18 of the shield 12 to prevent the hardenable material from escaping the mold. Specifically, the end portion 18 of the shield 12 that is internal to the mold and not compressed to the shell 14 gets flooded with the hardenable material. The method 100 further includes a step 114 of curing the hardenable material about the end portion 18 of the shield 12 to form the shell 14. In this embodiment, the shell 14 is formed such that the shield 12 is embedded within the end portion 20 of the shell 14 without the use of the connector 16. As in the previous embodiment, it is to be understood that the term "curing" may refer to any known physical or chemical process for solidifying the hardenable material.

It is to be understood that the above description is intended to be illustrative and not restrictive. Many alternative approaches or applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future examples. In sum, it should be understood that the invention is capable of modification and variation and is limited only by the following claims.

The present embodiments have been particularly shown and described, which are merely illustrative of the best modes. It should be understood by those skilled in the art that various alternatives to the embodiments described herein may be employed in practicing the claims without departing from the spirit and scope as defined in the following claims. It is intended that the following claims define the scope of the invention and that the method and apparatus within the scope of these claims and their equivalents be covered thereby. This description should be understood to include all novel and non-obvious combinations of elements described herein, and claims may be presented in this or a later application to any novel and non-obvious combination of these elements. Moreover, the foregoing embodiments are illustrative, and no single feature or element is essential to all possible combinations that may be claimed in this later application.

All terms used in the claims are intended to be given their broadest reasonable constructions and their ordinary meanings understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

What we claim is:

1. An electromagnetically shielded cable comprising:
   a shell having an end portion; and
   a shield embedded in said end portion of said shell;
   further comprising a connector integrally formed with said end portion of said shell and extending through said shield for embedding said shield in said shell;
   wherein said shield presents an outer surface defining a plurality of openings and said connector extends through at least two of said plurality of openings.

2. An electromagnetically shielded cable comprising:
   a shell having an end portion; and
   a shield embedded in said end portion of said shell;
   further comprising a connector integrally formed with said end portion of said shell and extending through said shield for embedding said shield in said shell, wherein said connector has a continuous outer surface extending about a periphery of said shell.

* * * * *